United States Patent [19]

Gill

[11] Patent Number: 4,501,368

[45] Date of Patent: Feb. 26, 1985

[54] SUBSTRATE SUPPORT MODULE

[75] Inventor: Daniel G. Gill, Greensboro, N.C.

[73] Assignee: AT&T Technologies, Inc., New York, N.Y.

[21] Appl. No.: 426,500

[22] Filed: Sep. 29, 1982

[51] Int. Cl.³ .............................................. A47G 19/08
[52] U.S. Cl. ..................................... 211/41; 211/186; 108/111; 312/264; 403/14; 361/415
[58] Field of Search ................. 211/41, 186; 108/111; 312/257 SM, 257 A, 263, 264; 403/13, 14, 244, 230; 248/221.3, 221.4; 361/415

[56] References Cited

U.S. PATENT DOCUMENTS

| 2,702,127 | 2/1955 | Pastorius et al. | 211/41 |
| 3,184,069 | 5/1965 | Rosenberg | 211/41 |
| 3,696,936 | 10/1972 | Straccia et al. | 211/41 |
| 3,733,523 | 5/1973 | Reynolds et al. | 211/41 |
| 3,810,433 | 5/1974 | Posner | 211/41 |
| 4,044,448 | 8/1977 | Watanabe et al. | 108/111 X |

FOREIGN PATENT DOCUMENTS

| 1429670 | 1/1969 | Fed. Rep. of Germany | 211/41 |
| 2359110 | 6/1975 | Fed. Rep. of Germany | 403/14 |
| 1460886 | 10/1966 | France | 108/111 |

Primary Examiner—Ramon S. Britts
Assistant Examiner—Blair M. Johnson
Attorney, Agent, or Firm—D. D. Bosben

[57] ABSTRACT

A substrate support module (10) includes a series of vertically arranged guide shelves (12, 14 and 16) having front, intermediate and rear circular bosses (34, 36 and 38) projecting from opposite ends thereof. The first and third bosses (34 and 38) are tangentially received in elongated horizontal slots (40 and 44) in side support plates (18) to position and lock the shelves (12, 14 and 16) against vertical movement. The intermediate bosses (36) are tangentially received in vertical elongated slots (42) in the side support plates (18) to position and lock the shelves (12, 14 and 16) against horizontal movement. During assembly, edges of the slots (40, 42 and 44) tend to flatten or shave off small peripheral portions (50) of the bosses when the bosses are slightly oversize, whereby the oversize bosses can readily be assembled into the slots. Backplane assemblies (22) also are mounted on rear edges of the guide shelves (12, 14 and 16) in the same manner by circular bosses (52 and 58) and elongated slots (54 and 60).

11 Claims, 5 Drawing Figures

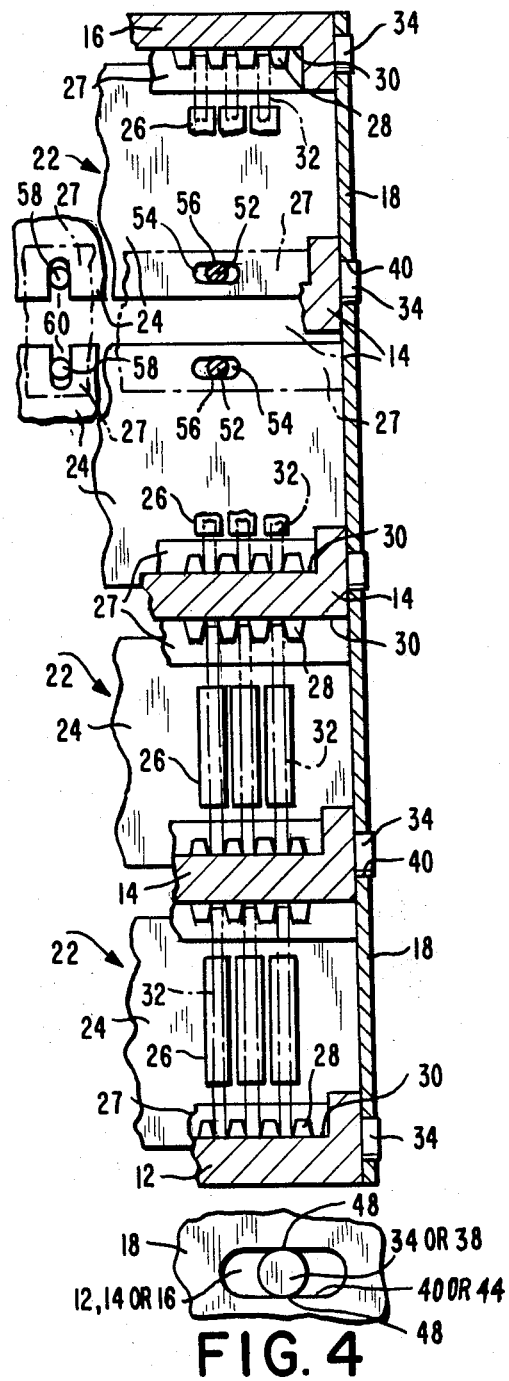
FIG. 2
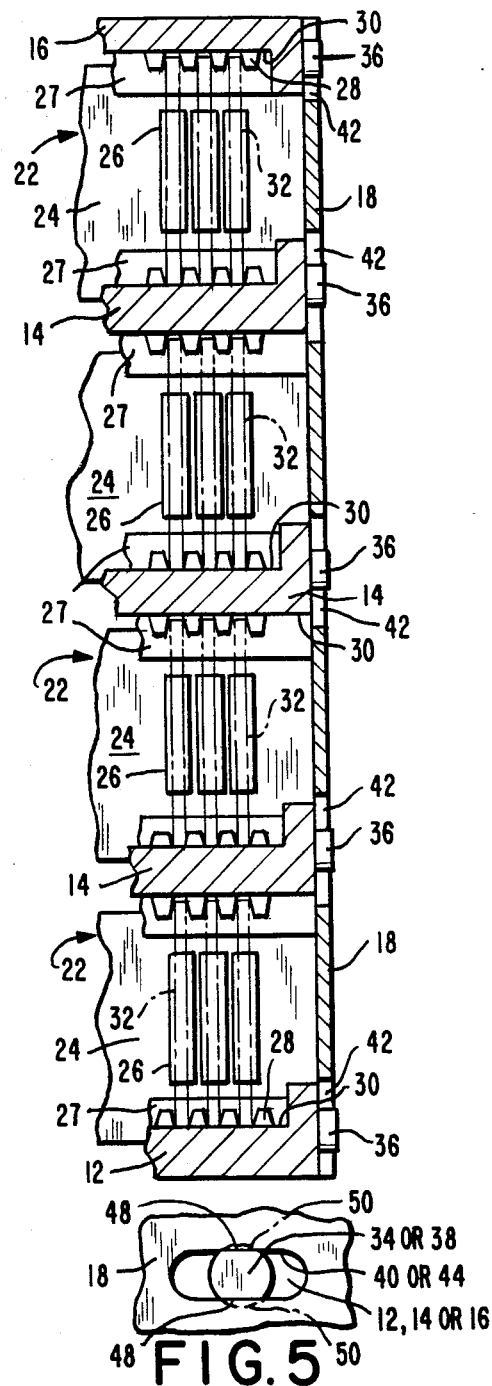
FIG. 3
FIG. 4
FIG. 5

SUBSTRATE SUPPORT MODULE

TECHNICAL FIELD

This invention relates to a substrate support module and more particularly to a substrate support module of rigid interlocking construction for use in a communications bay.

BACKGROUND OF THE INVENTION

In the assembly of various types of electronic apparatus, such as communication transmission equipment, a plurality of printed circuit boards are plugged into connector plugs of a backplane assembly for interconnection of the boards to other electronic apparatus. In order to facilitate the insertion of plug-in portions of the boards into the connector plugs, guide shelves are provided for supporting the boards and aligning the boards with the connector plugs. In this regard, upper guideways of one guide shelf cooperate with lower guideways of an adjacent guide shelf to slidably receive lower and upper edges, respectively, of the printed circuit boards, for this purpose.

In the past, the guide shelves, which frequently are of molded die cast construction, have been mounted in a transmission bay frame in various arrangements. For example, one or more sets of the guide shelves merely have been secured between opposed end or side support plates by mounting screws extended through clearance holes in the side support plates and then screw-threaded into the guide shelves. The side support plates subsequently are secured, by suitable integral brackets, to vertical frame members of the communications bay frame. In the alternative, the sets of guide shelves may be secured directly to the vertical frame members of the communications bay frame by mounting screws. In either instance, backplane assemblies, each comprising a backplane member having connector plugs mounted thereon, subsequently are secured to respective pairs of mounted guide shelves to form an assembly for receiving and connecting the printed circuit boards to respective ones of the connector plugs.

However, with the introduction of high density printed circuit boards and associated high density connector plugs, edge contact pads on the circuit boards and terminals on the connector plugs may be spaced extremely close together, such as on the order of 0.100". Accordingly, greater accuracy in the location of the guideshelves and the backplane assemblies with respect to one another is required to insure that the edge contact pads of the printed circuit boards mate properly with their respective terminals in the connector plugs. In this regard, the use of integrally formed locating bosses on the guide shelves and of conforming boss-receiving apertures in the side support plates, has been found to be not entirely suitable for this purpose. More specifically, it has been found that during the casting of the guide shelves, one or more of the bosses occasionally may be formed slightly oversize several thousandths of an inch, as a result of the casting apparatus opening slightly during the casting operation. Accordingly, when an attempt is made to assemble the guide shelf to a respective one of the side support plates, it is extremely difficult, and at times impossible, to force the oversize bosses into their associated boss-receiving apertures in the side support plates.

Accordingly, a purpose of this invention is to provide a new and improved substrate support module in which guide shelves and backplane assemblies can be readily and accurately assembled into the module.

SUMMARY OF THE INVENTION

In accordance with the invention, a substrate support module comprises at least one essentially planar guide shelf having guide means for guiding an edge of a substrate when the substrate is inserted into the substrate support module. A pair of side support members are located adjacent respective opposite ends of the guide shelf for supporting the shelf. A series of at least three projections extend from at least one end of the guide shelf into respective elongated slots in the pair of side support members in closely spaced relationship to opposed walls of the slots and in spaced relationship to opposite ends of the slots. In this connection, two of the elongated slots extend in a direction parallel to the guide shelf, and the remaining elongated slot extends in a direction perpendicular to the guide shelf.

More specifically, the substrate support module includes at least two of the guide shelves. Each guide shelf has at least three circular bosses extending from each end of the guide shelf into respective elongated slots in the side support members. Opposed walls of the elongated slots extend essentially tangent to adjacent peripheral portions of the circular bosses. Thus, when the circular bosses have inadvertently been formed oversize during manufacture, the bosses still can readily be assembled into their respective elongated slots as a result of mutual deformation between the peripheral portions of the bosses and the opposed walls of the slots, with edges of the slots tending to shave any excess material from the peripheral portions of the bosses. A backplane assembly also is secured to edges of the guide shelves extending between the opposite ends thereof, and is located on the edges of the guide shelves by the same type of circular boss-elongated slot arrangement.

BRIEF DESCRIPTION OF THE DRAWINGS

FIG. 2 is a cross-sectional view taken along the line 2—2 in FIG. 1;

FIG. 3 is a cross-section view taken along the line 3—3 in FIG. 1;

FIG. 4 is an enlarged partial view of a portion of the substrate support module; and FIG. 5 is a partial schematic view similar to FIG. 4, illustrating an assembling feature of the substrate support module.

DETAILED DESCRIPTION

Figure 1:
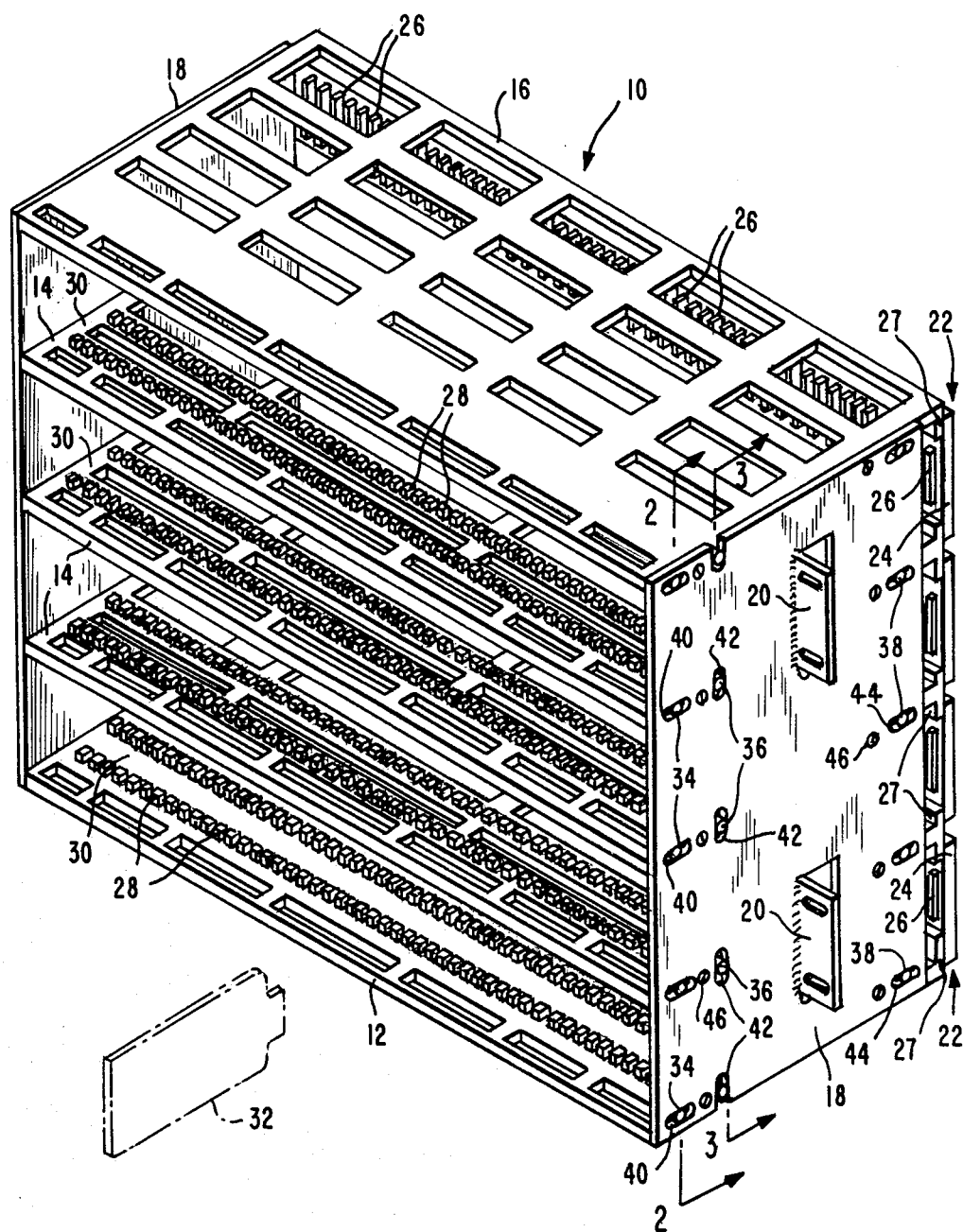
FIG. 1 is an isometric view of a substrate support module in accordance with the invention.

Referring to FIG. 1, a substrate support module 10 in accordance with the invention may include a lower guide shelf 12, a plurality of intermediate guide shelves 14, and an upper guide shelf 16. Opposite ends of the guide shelves 12, 14 and 16 are secured to a pair of vertically disposed metal (e.g., aluminum) side support plate members 18. The side support plate members 18 include projecting brackets 20 for mounting the assembled substrate support module 10 in a communications bay frame, not shown. A series of vertically disposed backplane assemblies 22, each consisting of a backplane member 24 having a row of connector plugs 26 mounted thereon, is secured to rear edge flanges 27 of a pair of adjacent ones of the guide shelves 12, 14 and 16.

Referring to FIGS. 1, 2 and 3, the guide shelves 12, 14 and 16, which may be of molded construction, such as die cast aluminum, each includes a plurality of rows of integrally formed aligned guide lugs 28 which project from planar surfaces 30 of the shelves. The guide lugs 28 define guideways for guiding edges of substrates, such as printed circuit boards 32, into respective ones of the connector plugs 26 when the printed circuit boards are inserted into the substrate support module 10 between the shelves. In this regard, the lower guide shelf 12 has the guide lugs 28 formed only on an upper planar surface 30 thereof, for guiding lower edges of a lower row of the printed circuit boards 32. Similarly, the upper guide shelf 16 is of essentially identical construction, but inverted in the substrate support module 10 (see FIGS. 2 and 3) so that the guide lugs 28 of this shelf project downwardly for guiding upper edges of an upper row of the printed circuit boards 32. Each of the intermediate guide shelves 14, however, has the guide lugs 28 formed on both upper and lower planar surfaces 30 thereof for guiding lower and upper edges, respectively, of the printed circuit boards 32.

As is shown in FIG. 1 by the right-hand ends of the guide shelves 12, 14 and 16, each of the opposite ends of each guide shelf includes a series of locating projections in the form of a front first circular boss 34, an intermediate second circular boss 36, and a rear third circular boss 38, integrally formed with the end of the guide shelf so as to extend outwardly therefrom. As is also shown in FIG. 1 by the right-hand side support plate 18 in this figure, each of the side support plates is formed with elongated front, intermediate and rear locating slots 40, 42 and 44, respectively, for receiving respective ones of the projecting bosses 34, 36 and 38 in close-fitting relationship to opposed walls of the slots. The side support plate 18 also is secured to the shelves 12, 14 and 16 by suitable screws 46.

More specifically, referring to FIGS. 1 and 2, the opposed walls of the front and rear slots 40 and 44 extend horizontally and thus parallel to the planar surfaces 30 of the guide shelves 12, 14 and 16. Thus, the opposed walls of slots 40 and 44 receive their respective front and rear circular bosses 34 and 38 therebetween in close-fitting tangential relationship to position and lock the shelves against movement in a vertical direction, with the bosses spaced from opposite ends of the slots. Similarly, referring to FIGS. 1 and 3, the opposed walls of the intermediate slots 42 extend vertically and perpendicularly to the planar surfaces 30 of the guide shelves 12, 14 and 16, and receive their respective intermediate circular bosses 36 therebetween in close-fitting tangential relationship to position and lock the shelves against movement in a horizontal direction, with the bosses spaced from the opposite ends of the slots.

Referring to FIG. 4, it is seen that as a result of the front and rear circular bosses 34 and 38 on each of the guide shelves 12, 14 and 16 being tangentially received in their associated slots 40 and 44 in one of the side support plates 18 as above-described, the only parts of the front and rear bosses 34 and 38 which engage the side support plate when the guide shelf is assembled to the side support plate, are peripheral portions 48 of the bosses on upper and lower sides thereof. Thus, referring to FIG. 5, in the event the bosses 34 and 38 have been formed slightly oversize vertically during a casting operation, the bosses still can readily be inserted into the slots 40 and 44 as a result of mutual deformation between the boss peripheral portions 48 and the opposed walls of the slots. For example, it has been found that adjacent edges of the slots 40 and 44 will tend to flatten or shave off any small excess material portions 50 (shown by broken lines and exaggerated for purposes of illustration) of the boss peripheral portions 48 during assembly of the circular bosses 34 and 38 within the slots. At the same time, the associated intermediate boss 36 (FIGS. 1 and 3) on the guide shelf 12, 14 or 16 is readily received in its associated vertical slot 42 in the side support plate 18 to locate the front and rear bosses 34 and 38 longitudinally in their respective slots 40 and 44, and to lock the guide shelf against horizontal movement relative to the side support plate as described hereinabove.

Further in this regard, since the intermediate bosses 36 (FIGS. 1 and 3) are received in their vertical elongated slots 42 in spaced relationship to the ends of the slots, the fact that the intermediate bosses have been formed oversize in a vertical direction has no effect upon the assembling of these bosses into their slots. For the same reason, in the event the first and third bosses 34 and 38 have been formed oversize in a horizontal direction, the resultant oversize horizontal dimension has no effect on the assembling of these bosses into their respective horizontal slots 40 and 44. In addition, in the event the intermediate bosses 36 have been formed oversize in a horizontal direction, the bosses still can readily be assembled into the vertical slots 42 as a result of edges of the slots flattening or shaving off small amounts of peripheral material from the bosses, as illustrated in FIG. 5 for the bosses 34 and 38.

The backplane assemblies 22 also are mounted on the rear edge flanges 27 of their respective pairs of the guide shelves 12, 14 and 16 utilizing a circular boss-elongated slot arrangement as described above for the side support plates 18. In this regard, referring to the upper portion of FIG. 2, as is illustrated by one of the intermediate guide shelves 14, each of the rear edge flanges 27 of the guide shelves 12, 14 and 16 includes a projecting circular locating boss 52 adjacent each end of the shelf. Each of the circular bosses 52 is receivable tangentially in an associated elongated horizontal locating slot 54 in one of the backplane members 24 with only peripheral portions 56 of the boss engaging the backplane member, to position and lock the associated backplane assembly 22 against vertical movement on its respective pair of shelves. Accordingly, the circular bosses 52 of the shelves 12, 14 and 16 readily can be assembled into their respective slots 54 (FIG. 2) in the backplane members 24 even when the bosses are slightly oversize in a vertical direction, as a result of mutual deformation between the boss peripheral portions 56 and opposed walls of the slots, as described hereinabove for the circular bosses 34 and 38.

With further reference to the upper portion of FIG. 2, each rear edge flange 27 of each of the guide shelves 12, 14 and 16 also includes a projecting intermediate circular locating boss 58 receivable tangentially in a vertical locating slot 60 in the backplane member 24 of the associated backplane assembly 22, to position and lock the backplane assembly against horizontal movement on its respective pair of shelves. As in the case of the side support plates 18, the backplane assembly 24 also is secured to its respective pair of the guide shelves 12, 14 and 16 by suitable screws (not shown).

In summary, a new and improved substrate support module 10, comprising the guide shelves 12, 14 and 16, the side support plates 18 and the backplane assemblies 22, has been provided. Each of the guide shelves 12, 14 and 16 includes integrally formed opposite end circular bosses 34, 36 and 38, rear edge end circular bosses 52 and rear edge intermediate circular bosses 58 (FIG. 2). The bosses 34 and 38 are received in respective ones of the horizontal slots 40 and 44 in the side support plates 18 to position and lock the shelves 12, 14 and 16 against vertical movement, and the bosses 36 are received in respective ones of the vertical slots 42 in the side support plates 18 to position and lock the shelves against horizontal movement. Similarly, the rear edge end bosses 52 are received in the horizontal backplane member slots 54 (FIG. 2) and the rear edge intermediate bosses 58 (FIG. 2) are received in the backplane member vertical slots 60 to mount the backplane assemblies 22 accurately on the shelves 12, 14 and 16.

Further, as is best shown in FIG. 4, only the peripheral portions 48 of the bosses 34 and 38 engage the side support plates 18. Similarly, as is shown in the upper portion of FIG. 2, only the peripheral portions 56 of the bosses 52 engage the backplane members 24. Accordingly, any of the bosses 34, 38 and 52 which have been inadvertently formed slightly oversize in a vertical direction in a casting operation due to slight opening of the casting apparatus, still can be readily assembled in their respective ones of the slots 40, 44 and 54 as a result of mutual deformation between the boss peripheral portions 48 and 56 and the opposed walls of the slots. For example, as is illustrated in FIG. 5 for the bosses 34 and 38, adjacent edges of the slots 40, 44 and 54 may flatten or shave off small amounts of excess material 50 from the boss peripheral portions 48 and 56 during the assembling operation. At the same time, any of the intermediate bosses 36 or the shelf rear edge intermediate bosses 58 which also have been formed oversize vertically still can readily be assembled into the side support plate vertical slots 42 or the backplane vertical slots 60, respectively, as a result of the bosses being spaced from the opposite ends of the slots. In addition, any of the intermediate bosses 36 or 58 which have been formed oversize in a horizontal direction, also can be readily assembled into their respective slots 42 or 60 as a result of mutual deformation between the peripheral portions of the bosses and/or the opposed walls of the slots.

What is claimed is:

1. A substrate support module, which comprises:
   at least one essentially planar guide shelf having guide means for guiding an edge of a substrate when the substrate is inserted into the substrate support module;
   a pair of side support members located adjacent respective opposite ends of the guide shelf for supporting the shelf;
   a series of at least three locating projections extending from at least one end of the guide shelf for mounting the shelf on the side support member which is adjacent the one end of the shelf; and
   the side support member adjacent the one end of the guide shelf having a set of at least three spaced elongated locating slots formed therein, the projections on the guide shelf being received in respective ones of the elongated slots in closely spaced relationship by opposed walls of the slots and in spaced relationship to opposite ends of the slots, with two of elongated slots extending parallel to the guide shelf and the remaining slot extending perpendicular to the guide shelf.

2. The substrate support module as recited in claim 1, in which:
   the elongated slot which extends perpendicular to the guide shelf is located intermediate the elongated slots which extend parallel to the guide shelf.

3. The substrate support module as recited in claim 1, in which:
   the projections on the end of the guide shelf are circular bosses.

4. The substrate support module as recited in claim 3, in which:
   the opposed walls of the elongated slots in the side support member extend essentially tangent to adjacent peripheral portions of their respective circular bosses such that edges of the slots tend to shave any excess material from the peripheral portions during assembly of the circular bosses within the slots.

5. The substrate support module as recited in claim 1, which further comprises:
   a series of at least three locating projections extending from an edge of the guide shelf between the opposite ends of the guide shelf;
   a backplane assembly mounted on the edge of the guide shelf, the backplane assembly including a backplane member; and
   the backplane member having a set of at least three spaced elongated locating slots formed therein, the projections on the edge of the guide shelf being received in respective ones of the elongated slots in closely spaced relationship by opposed walls of the slots and in spaced relationship to opposite ends of the slots, with two of the elongated slots extending parallel to the guide shelf and the remaining elongated slot extending perpendicular to the guide shelf.

6. The substrate support module as recited in claim 5, in which:
   the elongated slot in the backplane member which extends perpendicular to the guide shelf is located intermediate the elongated slots in the backplane member which extend parallel to the guide shelf.

7. The substrate support module as recited in claim 5, in which:
   the projections on the one end of the guide shelf and on the edge of the guide shelf are circular bosses.

8. The substrate support module as recited in claim 7, in which:
   the opposed walls of the slots in the side support member and the backplane member extend essentially tangent to adjacent peripheral portions of their respective circular bosses such that edges of the slots tend to shave any excess material from the peripheral portions during assembly of the circular bosses in the slots.

9. A substrate support module, which comprises:
   at least two spaced essentially planar guide shelves each having guide means for guiding respective edges of a substrate when the substrate is inserted between the shelves;
   a pair of side support members located at respective opposite ends of the shelves;
   a series of at least three circular locating bosses extending from each end of each of the shelves for mounting the shelves on the side support members; and
   each of the side support members having sets of at least three elongated locating slots formed therein, the circular bosses on the guide shelves being received in respective ones of the elongated slots in closely spaced tangential relationship by opposed walls of the slots and in spaced relationship to opposite ends of the slots, with two of the elongated slots of each set extending parallel to the guide shelves and the remaining slot of the set extending perpendicular to the guide shelves.

10. The substrate support module as recited in claim 9, which further comprises:
a series of at least three circular locating bosses extending from an edge of each guide shelf between the opposite ends of the guide shelf;
a backplane assembly mounted on the edges of the guide shelves, the backplane assembly including a backplane member; and
the backplane member having sets of at least three elongated locating slots formed therein, the circular bosses on the edges of the guide shelves being received in respective ones of the elongated slots in closely spaced tangential relationship by opposed walls of the slots and in spaced relationship to opposite ends of the slots, with two of the elongated slots of each set extending parallel to the guide shelves and the remaining slot of the set extending perpendicular to the guide shelves.

11. The substrate support module as recited in claim 10, in which:
the elongated slots in the side support members and the backplane member which extend perpendicular to the guide shelves are located intermediate respective ones of the elongated slots which extend parallel to the guide shelves.

* * * * *